(12) United States Patent
Yang

(10) Patent No.: US 8,298,956 B2
(45) Date of Patent: Oct. 30, 2012

(54) METHOD FOR FABRICATING FINE PATTERN

(75) Inventor: Hyun Jo Yang, Cheongju-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/243,895

(22) Filed: Sep. 23, 2011

(65) Prior Publication Data

US 2012/0156850 A1 Jun. 21, 2012

(30) Foreign Application Priority Data

Dec. 21, 2010 (KR) .................. 10-2010-0131798

(51) Int. Cl.
*H01L 21/302* (2006.01)
(52) U.S. Cl. ................. 438/708; 438/942; 257/E21.026
(58) Field of Classification Search .................. 438/707, 438/709, 944; 257/E21.023, E21.613
See application file for complete search history.

(56) References Cited

U.S. PATENT DOCUMENTS

2009/0325082 A1* 12/2009 Ryu .................................. 430/5

FOREIGN PATENT DOCUMENTS

| KR | 1020080022951 A | 3/2008 |
|---|---|---|
| KR | 1020080073622 A | 8/2008 |
| KR | 1020100054392 A | 5/2010 |

* cited by examiner

*Primary Examiner* — Cheung Lee
(74) *Attorney, Agent, or Firm* — William Park & Associates Ltd.

(57) ABSTRACT

A method for fabricating a fine pattern includes forming a first photomask including first light transmission regions set in a line shape over a first phase shift mask (PSM) region and a first binary mask (BM) region adjacent to the first phase shift mask region. A second photomask may be formed to include second light transmission regions set in a line shape over a second phase shift mask region and a second binary mask region adjacent to the second phase shift mask region, wherein the second light transmission regions intersect the first light transmission regions. A resist layer may first be exposed using the first photomask and secondly exposed using the second photomask. The first and secondly exposed resist layer may be developed to form resist patterns with open regions corresponding to portions where the first light transmission regions intersect the second light transmission regions.

16 Claims, 10 Drawing Sheets

METHOD FOR FABRICATING FINE PATTERN

CROSS-REFERENCES TO RELATED APPLICATIONS

The present application claims priority under 35 U.S.C 119(a) to Korean Application No. 10-2010-0131798, filed on Dec. 21, 2010 in the Korean intellectual property Office, and is incorporated herein by reference in its entirety.

BACKGROUND

Exemplary embodiments of the present invention relate to a method for fabricating a semiconductor device, and more particularly, to a method for fabricating a fine pattern using a double lithography.

As the design rule of a semiconductor device shrinks, the sizes of patterns constituting the semiconductor device have been reduced. As patterns for a dynamic random access memory (DRAM) or a phase change random access memory (PCRAM) become finer, pattern forming techniques using a double lithography or a double patterning have been attempted to fabricate fine patterns on a wafer smaller than a resolution that can be realized in a lithography process.

A first resist pattern is formed and then a second resist pattern is formed on a resulting structure in which the first resist pattern is formed. A fine pattern may be realized by the combination of the first resist pattern and the second resist pattern. However, in the case of coating a resist layer twice and separately performing an exposure process and a development process on the respective resist layers, a process of freezing the first resist pattern is required because the first resist pattern exposed and developed may be influenced and deformed during the subsequent coating, exposure, and development of the second resist layer. As such, since the two-time exposure and development processes, in addition to the freezing process, are required, the process may become quite complicated. Thus, there is a need to develop a method which can further simplify the process of fabricating a fine pattern.

SUMMARY

An embodiment of the present invention is directed to a method that can suppress a pattern bridge during an exposure process by the improvement of a photomask, when a resist layer is coated and a fine pattern is formed on the resist layer by a double lithography using two photomasks.

In one embodiment, a method for fabricating a fine pattern includes forming a first photomask including first light transmission regions set in a line shape over a first phase shift mask (PSM) region and a first binary mask (BM) region adjacent to the first phase shift mask region. A second photomask may be formed that includes second light transmission regions set in a line shape over a second phase shift mask region and a second binary mask region adjacent to the second phase shift mask region. The second light transmission regions may intersect the first light transmission regions. A resist layer may first be exposed using the first photomask and then exposed using the second photomask. The resist layer exposed using the first and second photomasks may be developed to form resist patterns with open regions corresponding to portions of the first light transmission regions that intersect the second light transmission regions.

In another embodiment, a method for fabricating a fine pattern includes forming a first photomask that includes a first phase shift mask region including a first phase shift layer with body portions of first light transmission regions having a line shape on a first transparent substrate. The first photomask may also include a first binary mask region including a first light blocking layer with end portions of the first light transmission regions. The method may also include forming a second photomask that includes a second phase shift mask region including a second phase shift layer with body portions of second light transmission regions having a line shape on a second transparent substrate. The second light transmission regions may intersect the first light transmission regions. The second photomask may also include a second binary region including a second light blocking layer setting end portions of the second light transmission regions. A resist layer may be formed on an under layer, and regions corresponding to the first light transmission regions of the resist layer may first be exposed using the first photomask. The regions corresponding to the second light transmission regions of the resist layer may then be exposed using the second photomask. The resist layer exposed using the first and second photomasks may be developed to form resist patterns with open regions corresponding to portions where the first light transmission regions intersect the second light transmission regions.

In another embodiment, a method for fabricating a fine pattern includes forming a first photomask including first cell light transmission regions and a first dummy light transmission region in a line shape extending over a first phase shift mask region and a first binary mask region adjacent to the first phase shift mask region. A second photomask may be formed that includes second cell light transmission regions and a second dummy light transmission region in a line shape extending over a second phase shift mask region and a second binary mask region adjacent to the second phase shift mask region, where the second cell light transmission regions and the second dummy light transmission region intersect the first cell light transmission regions and the first dummy light transmission region and. A resist layer may be formed on an under layer. The resist layer may first be exposed using the first photomask and then exposed using the second photomask. The resist layer exposed using the first and second photomasks may be developed to form resist patterns with open regions corresponding to portions of the first cell light transmission regions and the first dummy light transmission region intersecting the second cell light transmission regions and the second dummy light transmission region. The cell hole patterns and dummy hole patterns may be formed by etching portions of the under layer exposed to the resist patterns.

The first phase shift mask region may be formed to include a phase shift layer that opens a portion of a transparent substrate of the first photomask corresponding to the first cell light transmission region that is located in the first phase shift mask region on the transparent substrate, and the first binary mask region may be formed to include a dual layer of a phase shift layer and a light blocking layer, which opens a portion of the transparent substrate of the first photomask corresponding to the first light transmission region that is located in the first binary mask region on the transparent substrate.

The first photomask may be substantially similar to the second photomask rotated by 90 degrees.

The first light transmission regions may include first cell light transmission regions repetitively arranged in a line shape and a first dummy light transmission region in a line shape arranged outside the first cell light transmission regions, wherein a line width of the first dummy light transmission region is larger than the line width of the first cell light transmission region.

In a phase change memory device including bottom electrodes, phase change layers, and top electrodes, pillars may be formed to fill the hole patterns, where the pillars may be formed as the bottom electrodes of the phase change memory device.

The forming of the first and second photomasks may include obtaining a target layout that includes the cell hole patterns and the dummy hole patterns disposed outside the cell hole patterns. A layout of the first and second cell light transmission regions and the first and second dummy light transmission regions may be obtained, in which the cell hole patterns are set by the portions of the first cell light transmission regions that intersect the second cell light transmission regions, and the dummy hole patterns are set by the portions of the first dummy light transmission region that intersect the second cell light transmission regions, the portions of the second dummy light transmission region that intersect the first cell light transmission regions, and the regions of the first dummy transmission regions that intersect the second dummy transmission regions. The first and second phase shift mask regions and the first and second binary mask regions may be set in the layout of the first and second cell light transmission regions and the first and second dummy light transmission regions. The first photomask may be formed using the layout of the first cell light transmission regions and the first dummy light transmission region, and the second photomask may be formed using the layout of the second cell light transmission regions and the second dummy light transmission region.

BRIEF DESCRIPTION OF THE DRAWINGS

The above and other aspects, features, and other advantages will be more clearly understood from the following detailed description taken in conjunction with the accompanying drawings, in which.

DESCRIPTION OF SPECIFIC EMBODIMENTS

Hereinafter, embodiments of the present invention will be described with reference to accompanying drawings. However, the various embodiments are for illustrative purposes only and are not intended to limit the scope of the invention.

A method for fabricating a fine pattern according to an embodiment of the present invention may be performed by a lithography-lithography-etch (LLE) process that includes sequentially performing a first exposure and a second exposure on a resist layer, forming a resist pattern by developing an overlapped portion of the first exposure and the second exposure, and performing an etch process using the resist pattern as an etch mask. A photomask system is configured with a first photomask and a second photomask. In the first photomask, a mask pattern having a line and space shape is formed as a phase shift layer or a light blocking layer. The second photomask is 90° rotated with respect to the first photomask. A grid-shaped resist pattern is formed by performing the first exposure, the second exposure, and the development using the photomask system. This method for fabricating the fine pattern can overcome the exposure limitation or the pattern resolution limitation in a single exposure process and can form a finer pattern.

During the patterning process using the two-time exposures, a pattern bridge phenomenon may occur so that patterns do not exactly have an intended shape at ends of the patterns and are connected to adjacent patterns. In order to suppress the pattern bridge phenomenon, a portion of a photomask corresponding to an end of a pattern is configured as a binary mask (BM) region, and a portion of the photomask corresponding to a middle body portion of the pattern is configured as a phase shift mask (PSM) region.

The PSM region may improve a contrast of a pattern by a light path shift of the phase shift layer, but the intensity of light incident on the resist layer disposed on the semiconductor substrate or wafer is relatively reduced. The reduction in the intensity of light is caused by a destructive interference between light of the shifted light path and normal light. The pattern bridge phenomenon is caused because a dose or light intensity lower than a threshold intensity at which the resist is exposed is incident on the resist layer. Thus, by configuring a portion of the photomask corresponding to the end of the pattern as a binary mask region, an exposure dose or exposure intensity in the binary mask region are relatively increased to thereby effectively suppress the pattern bridge phenomenon.

This can obtain an effect similar to a case of performing an exposure process on the end of the pattern at higher exposure dose or exposure intensity. That is, by inducing an effect of increasing the exposure intensity, it is possible to effectively suppress the pattern bridge phenomenon caused by exposure failure due to an underdose at which exposure intensity is insufficient.

Figure 1:
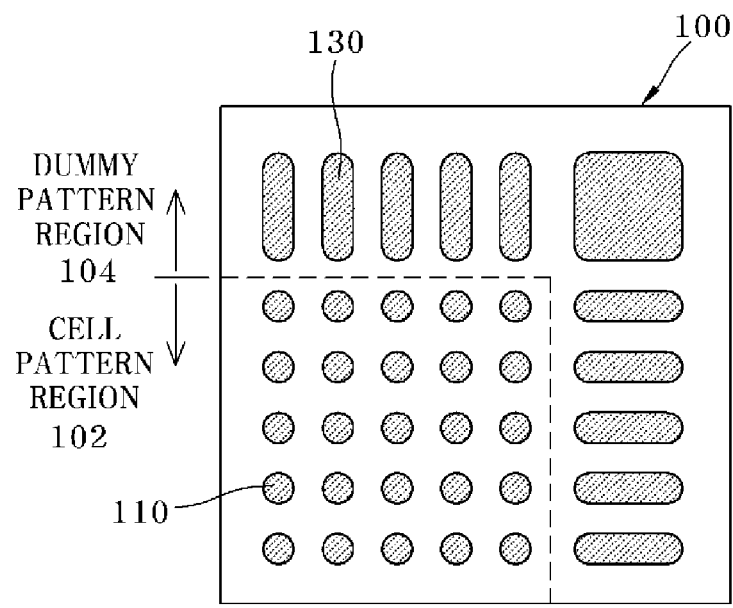
FIGS. 1 to 5 are layout views of photomasks used in a method for fabricating a fine pattern according to embodiments of the present invention.

Referring to FIG. 1, there is shown a target layout 100 with a cell pattern region 102 and a dummy pattern region 104. The cell pattern region 102 may comprise cell hole patterns 110, such as contact holes, and the dummy pattern region may comprise dummy hole patterns 130.

Although the cell patterns have been exemplified as hole patterns, the cell patterns may also be set by hard mask patterns or other patterns as a pillar or active region, in addition to the hole patterns. When the target layout 100 of the pattern to be formed is designed, dummy hole patterns 130 are disposed to facilitate a continuous pattern arrangement regularity of the cell hole patterns 110. The dummy hole patterns 130 provide a similar environment to that of the cell hole patterns 110 when adjacent cell hole patterns 110 are exposed/transferred or etched. Thus, the dummy hole patterns 130 make it possible to pattern the cell hole patterns 110 adjacent to the dummy hole patterns 130 in a more exact shape by the exposure/transfer or etch process. The dummy hole patterns 130 may be designed to have a line width larger than that of the cell hole patterns 110. In addition, the dummy hole patterns 130 may be designed to have, for example, the same or other shape as the cell hole patterns 110. The dummy hole patterns may have, for example, a rectangular shape, while the cell hole patterns 110 are designed to have a circular shape.

Figure 2:
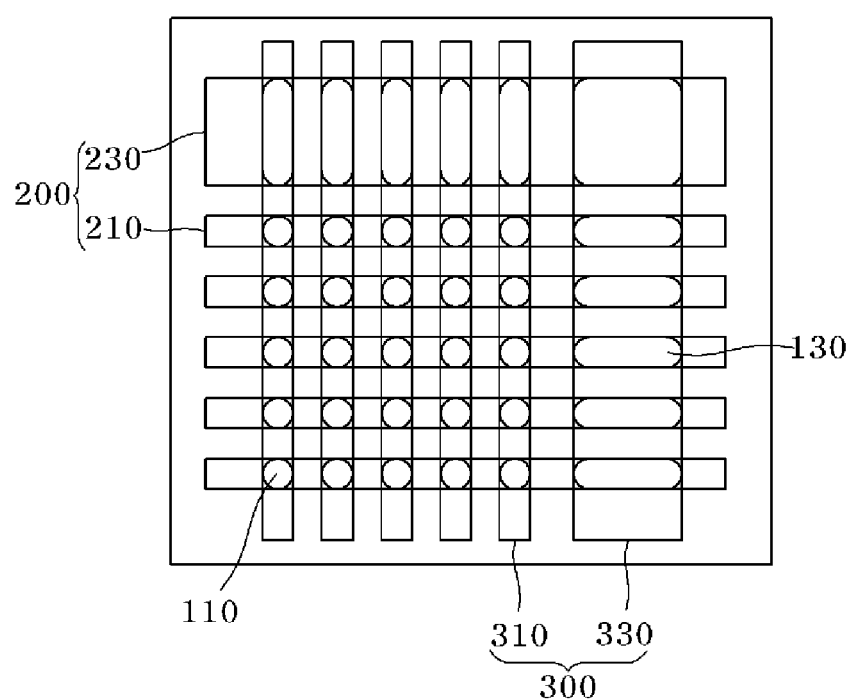

Referring to FIG. 2, a process is described using photomask layouts 200 and 300 for forming the target layout 100 including the cell hole patterns 110 and the dummy hole patterns 130 disposed at the outside of the cell hole patterns 110. First cell light transmission regions 210 and second cell light transmission regions 310 are designed in a line shape so that they cross where the cell hole patterns 110 are desired. A first dummy light transmission region 230 is designed in a line shape at the outside of the first cell light transmission regions 210, and a second dummy light transmission region 330 is designed in a line shape at the outside of the second cell light transmission regions 310. Dummy hole patterns 130 are disposed where the portions of the first cell light transmission regions 210 and the second dummy light transmission region 330 cross, and where the portions of the second cell light transmission regions 310 and the first dummy light transmission region 230. The first and second dummy light transmission regions 230 and 330 may have a line width larger than that of the first and second cell light transmission regions 210 and 310. The first photomask layout 200 including the first cell light transmission regions 210 and the first dummy light transmission region 230 is extracted, and the second photomask layout 300 including the second cell light transmission regions 310 and the second dummy light transmission region 330 is extracted.

Figure 3:
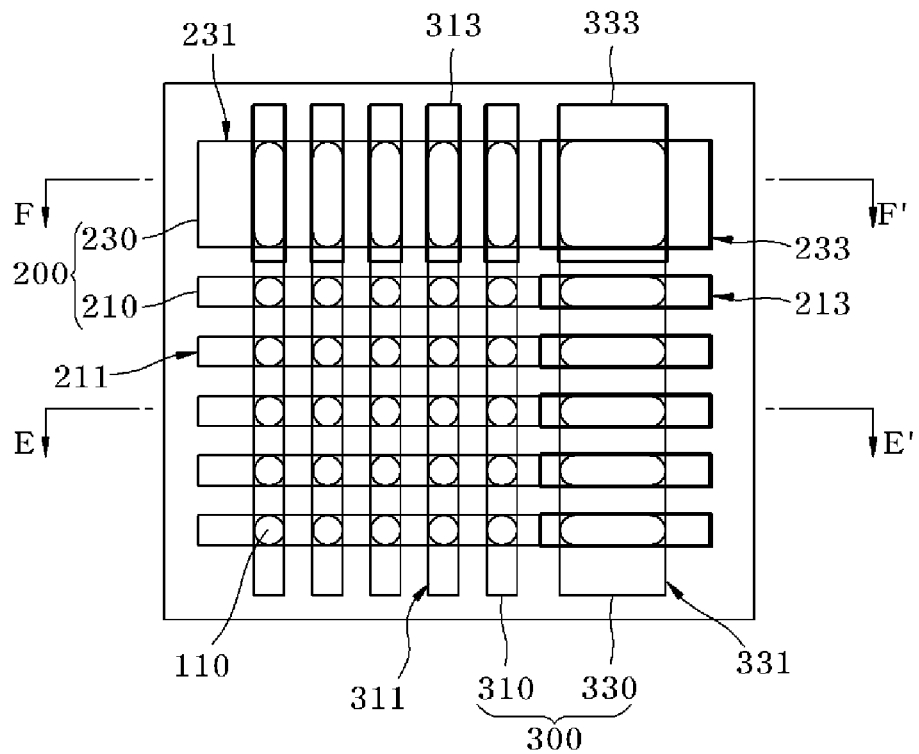

Referring to FIG. 3, portions 211, 231, 311 and 331 to be located in the phase shift mask (PSM) region and portions 213, 233, 313, and 333 to be located in the binary mask (BM) region are set in the first and second layouts 200 and 300. Since the pattern bridge phenomenon occurs at the ends of the patterns, the end portions 213 and 233 of the first cell light transmission regions 210 and the first dummy light transmission region 230 are set as the portions to be located in the BM region, and the body portions 211 and 231 of the inside thereof are set as the portions to be located in the PSM region. Likewise, the end portions 313 and 333 of the second cell light transmission regions 310 and the second dummy light transmission region 330 are set as the portions to be located in the BM region, and the body portions 311 and 331 of the inside thereof are set as the portions to be located in the PSM region. In this manner, the photomask layouts 200 and 300, in which the portions to be located in the PSM region and the BM region are set, are implemented with the photomasks.

Figure 4:
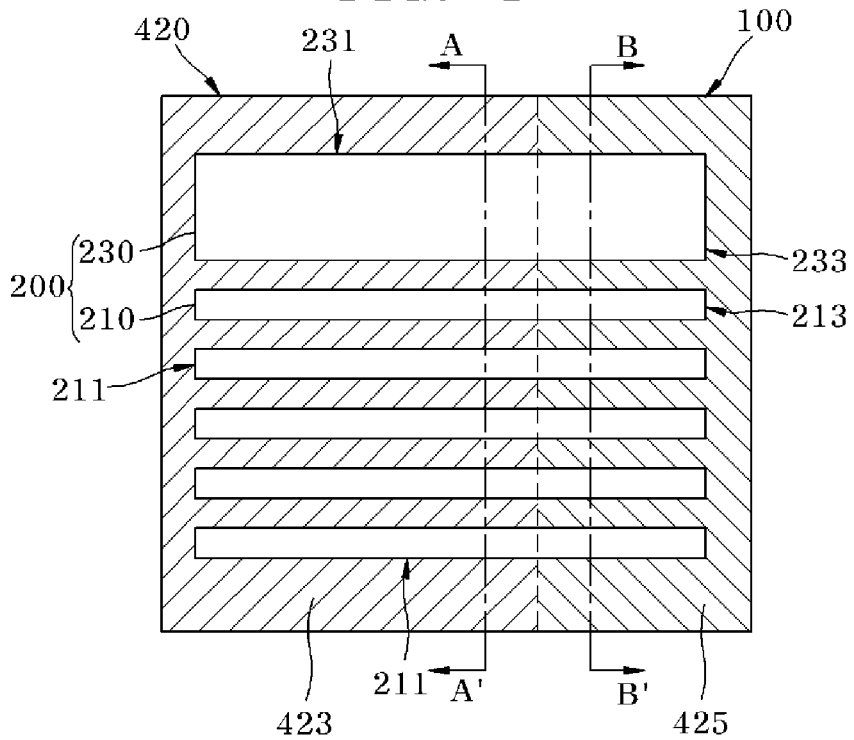
Figure 5:
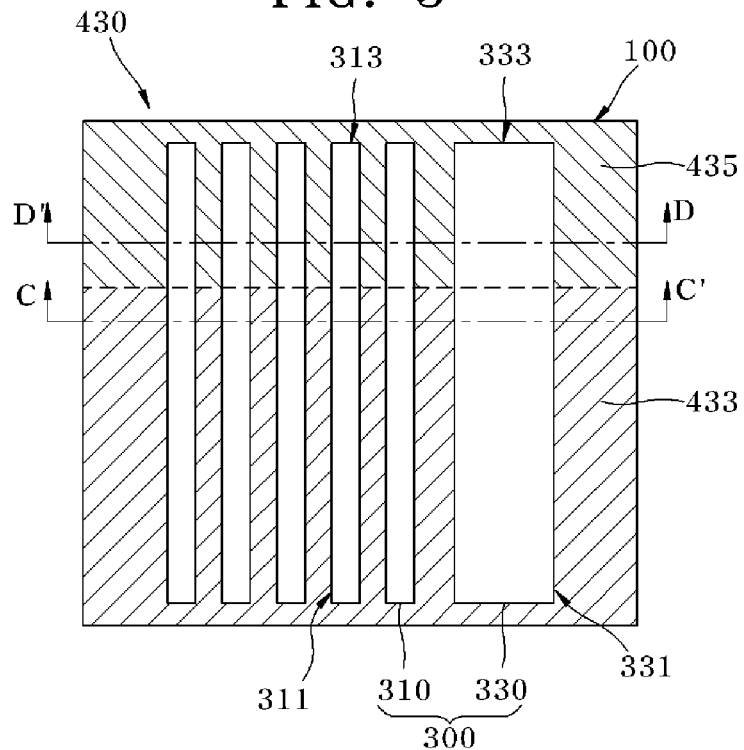
Figure 6:
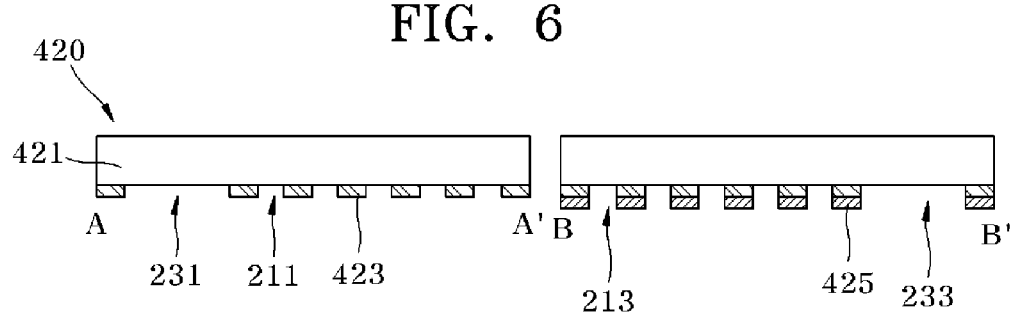
FIGS. 6 and 7 are cross-sectional views of the photomasks used in a method for fabricating a fine pattern according to an embodiment of the present invention.

A first photomask 420 of FIG. 4 implementing the first photomask layout 200 and a second photomask 430 of FIG. 5 implementing the second photomask layout 300 are formed by a photomask fabrication process. Referring to FIG. 4, and FIG. 6 illustrating a cross-sectional view taken along lines A-A' and B-B' of FIG. 4, a first phase shift layer 423 (e.g., a Mo—Si layer) and a first light blocking layer 425 (e.g., a Cr layer) are formed on a first transparent substrate 421 (e.g., a quartz substrate) and are then patterned to form the first photomask 420 including a PSM region and a BM region. In the PSM region, only the first phase shift layer 423 exposes the body portions 211 of the first cell light transmission region 210 and the body portion 231 of the first dummy light transmission region 230 as the exposed portions of the transparent substrate 421. This may be seen with respect to the cross-sectional view along line A-A' in FIG. 6. In the BM region the first light blocking layer 425 remaining on the first phase shift layer 423 exposes the end portions 213 of the first cell light transmission region 210 and the end portion 233 of the first dummy light transmission region 230 as the exposed portions of the first transparent substrate 421. This may be seen with respect to the cross-sectional view along line B-B' in FIG. 6. In this manner, the first photomask having both the PSM region and the BM region may be implemented by depositing and patterning the first phase shift layer 423 and the first light blocking layer 425 and selectively removing the first blocking layer 425.

The body portion 211 of the first cell light transmission region 210 of the first photomask 420 is located in the PSM region and provided as a region exposed by the first phase shift layer 423 like a PSM mask, and the body portion 231 of the first dummy light transmission region 230 is located in the PSM region and provided as the region exposed by the first phase layer 423 like the PSM mask. The end portion 213 of the first cell light transmission region 210 of the first photomask 420 is located in the BM region and provided as a region exposed by the first light blocking layer 425 like a BM mask, and the end portion 233 of the first dummy light transmission region 230 is located in the BM region and provided as the region exposed by the first light blocking layer 425 like the BM mask.

Figure 7:
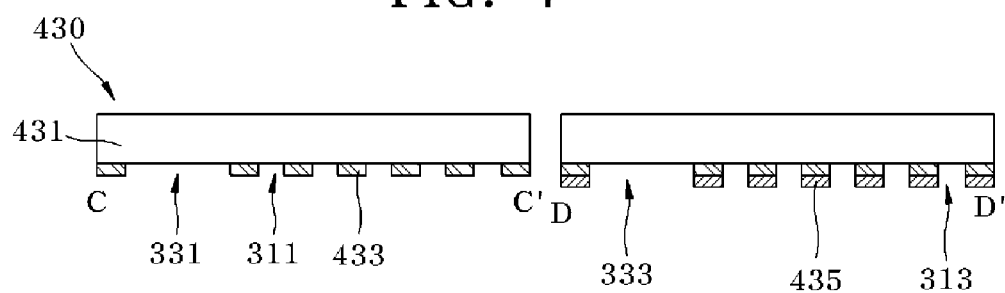

As illustrated in FIGS. 5 and 7 illustrating a cross-sectional view taken along lines C-C' and D-D' of FIG. 5, the second photomask 430 is similar to the first photomask 420 except that it is rotated 90° with respect to the first photomask 420. Referring to FIGS. 5 and 7, a second phase shift layer 433 (e.g., a Mo—Si layer) and a second light blocking layer 435 (e.g., a Cr layer) are formed on a second transparent substrate 431 (e.g., a quartz substrate) and are patterned to form the second photomask 430 including a PSM region and a BM region. In the PSM region, only the second phase shift layer 433 exposes the body portions 311 of the second cell light transmission region and the body portion 331 of the second dummy light transmission region as the exposed portions of the transparent substrate 431. This may be seen with respect to the cross-sectional view along line C-C' in FIG. 7. In the BM region, the second light blocking layer 435 remaining on the second phase shift layer 433 exposes the end portions 313 of the first cell light transmission region and the end portion 333 of the first dummy light transmission region as the exposed portions of the second transparent substrate 431. This may be seen with respect to the cross-sectional view along line D-D' in FIG. 7. In this manner, the second photomask is formed to have both the PSM region and the BM region.

First and second lithography processes are performed using the first and second photomasks 420 and 430.

Figure 8:
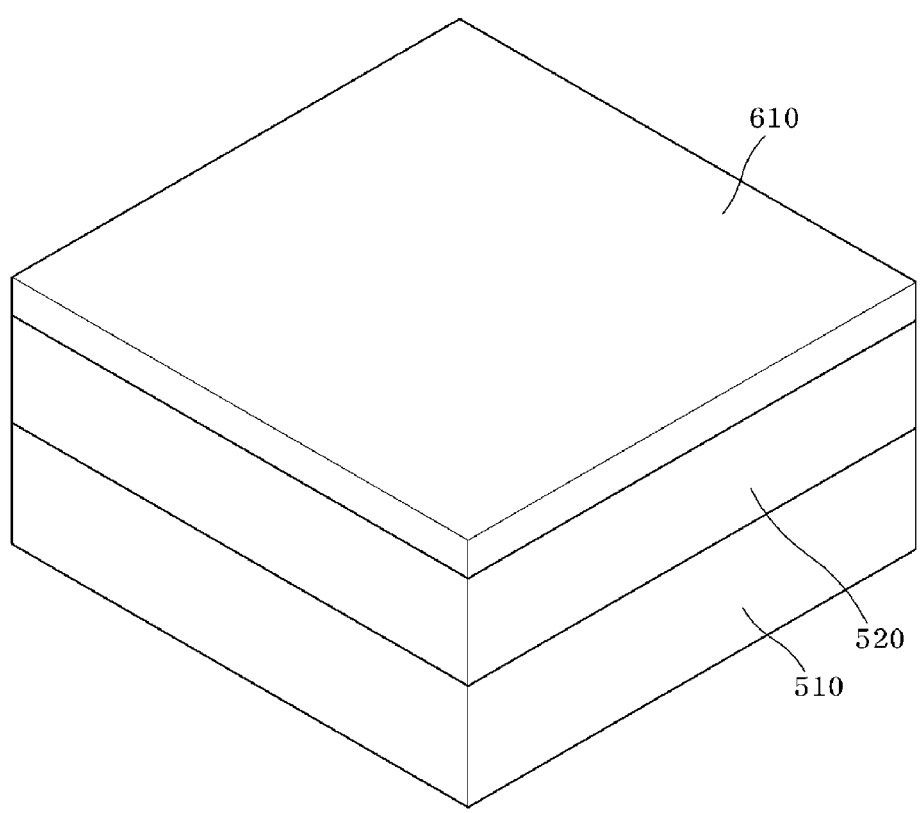
FIGS. 8 to 13 are cross-sectional views illustrating a method for fabricating a fine pattern according to an embodiment of the present invention.

Referring to FIG. 8, a semiconductor substrate 510 and an insulation layer 520 are provided as an under layer, and a resist layer 610 is coated on the insulation layer 520, which is an etch target layer. When an exposure process is performed using, for example, an ArF lithography equipment, the resist layer 610 may be formed of a resist for an ArF exposure.

Figure 9:
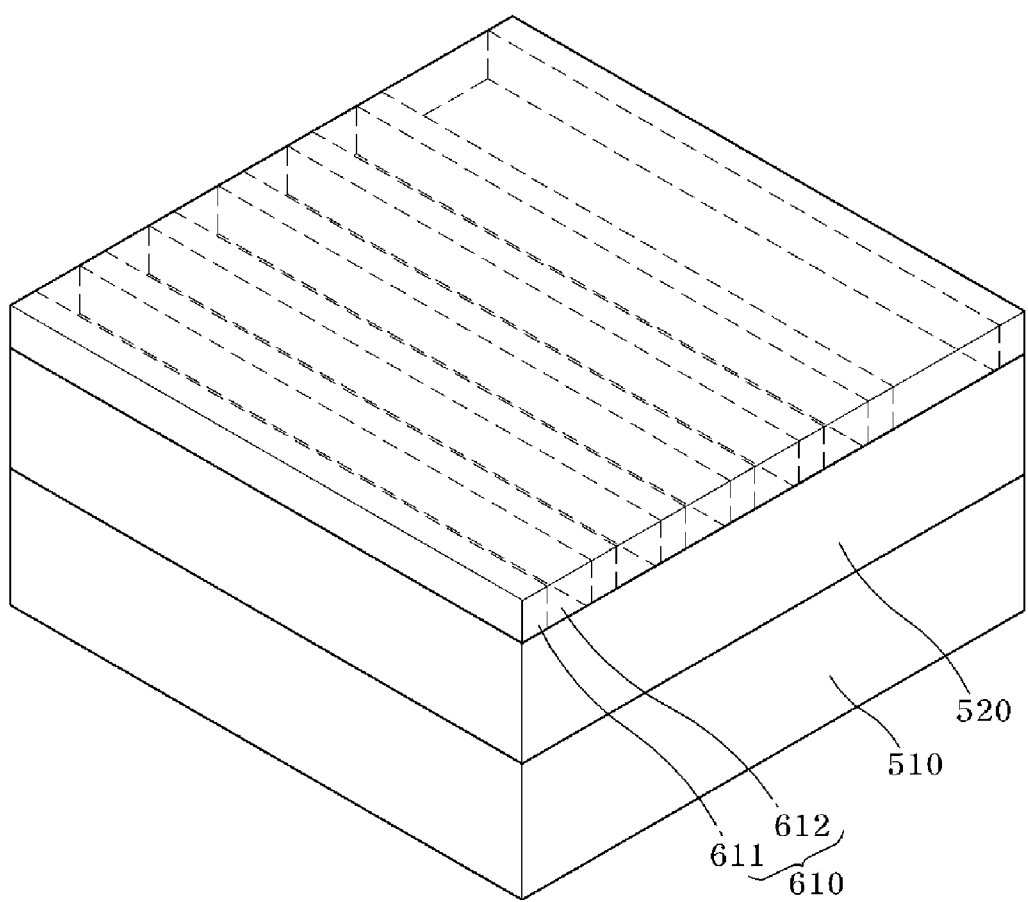

Referring to FIG. 9, a primary exposure is performed on the resist layer 610 by using the first photomask (420 in FIG. 4). Due to the first exposure, first resist regions 611, which are not firstly exposed, and second resist regions 612, which are firstly exposed, are formed in the resist layer 610. The second resist regions 612 corresponding to the first cell light transmission regions 210 and the first dummy light transmission region 230 are exposed. The second resist regions 612 are formed in a bar shape extending in a direction in which the first cell light transmission regions 210 and the first dummy light transmission region 230 of the first photomask 420 extend, for example, in an X-axis direction.

Figure 10:
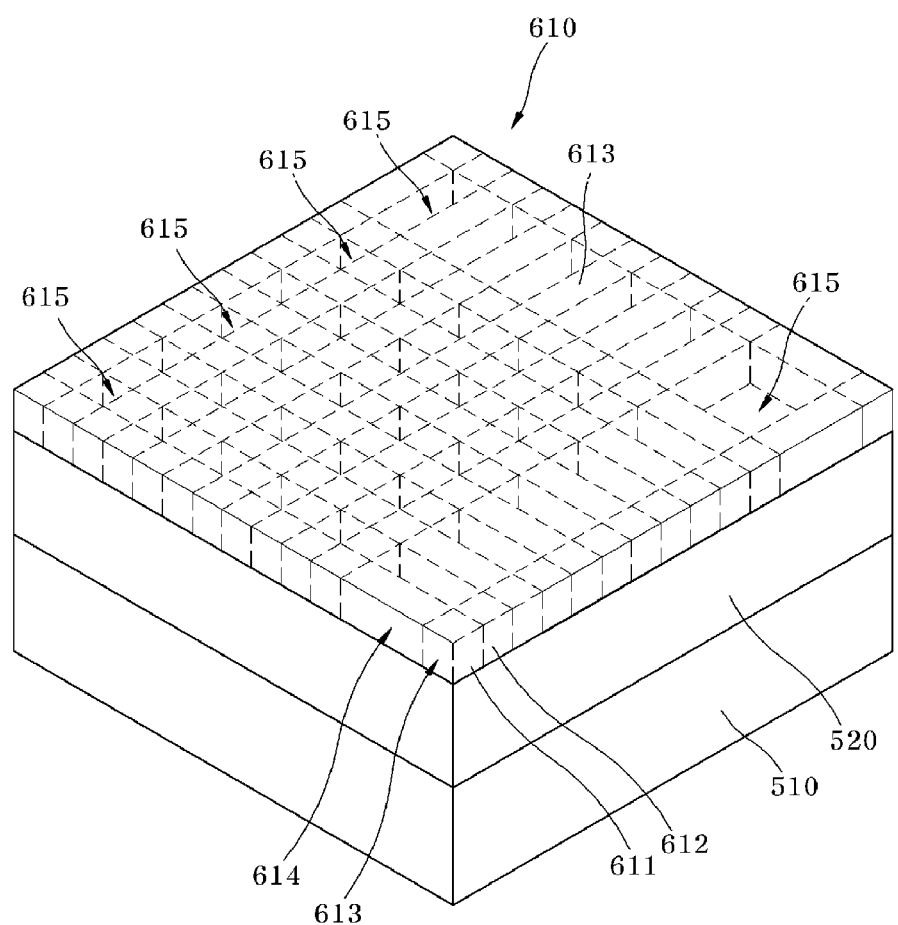

Referring to FIG. 10, a second exposure is performed on the first exposed resist layer 610 by using the second photomask (430 in FIG. 5). Due to the second exposure, third resist regions 613, which are not secondly exposed, and fourth resist regions 614, which are secondly exposed, are formed in the resist layer 610. The fourth resist regions 614 corresponding to the second cell light transmission regions 310 and the second dummy light transmission region 330 are exposed. The fourth resist regions 614 are formed in a bar shape extending in a direction in which the second cell light transmission regions 310 and the second dummy light transmission region 330 of the second photomask 430 extend, for example, in a Y-axis direction.

Regions corresponding to where portions of the first and second exposures intersect, that is, the portions of the first cell light transmission regions 210 intersecting with first dummy light transmission regions 230, and the portions of the second cell light transmission regions 310 intersecting with the second dummy light transmission regions 330, are set as the overlapped regions 615 of the first and second exposures. The overlapped regions 615 of the first and second exposures are regions to which light having exposure dose or exposure intensity higher than a threshold exposure intensity is irradiated, and the overlapped regions 615 are removed by a developing solution. Since the region to which only the first exposure is performed and the region to which only the second exposure is performed are regions to which light having exposure dose or exposure intensity lower than the threshold exposure intensity is irradiated, the regions are not developed in a subsequent development process and remain as solid patterns.

Figure 11:
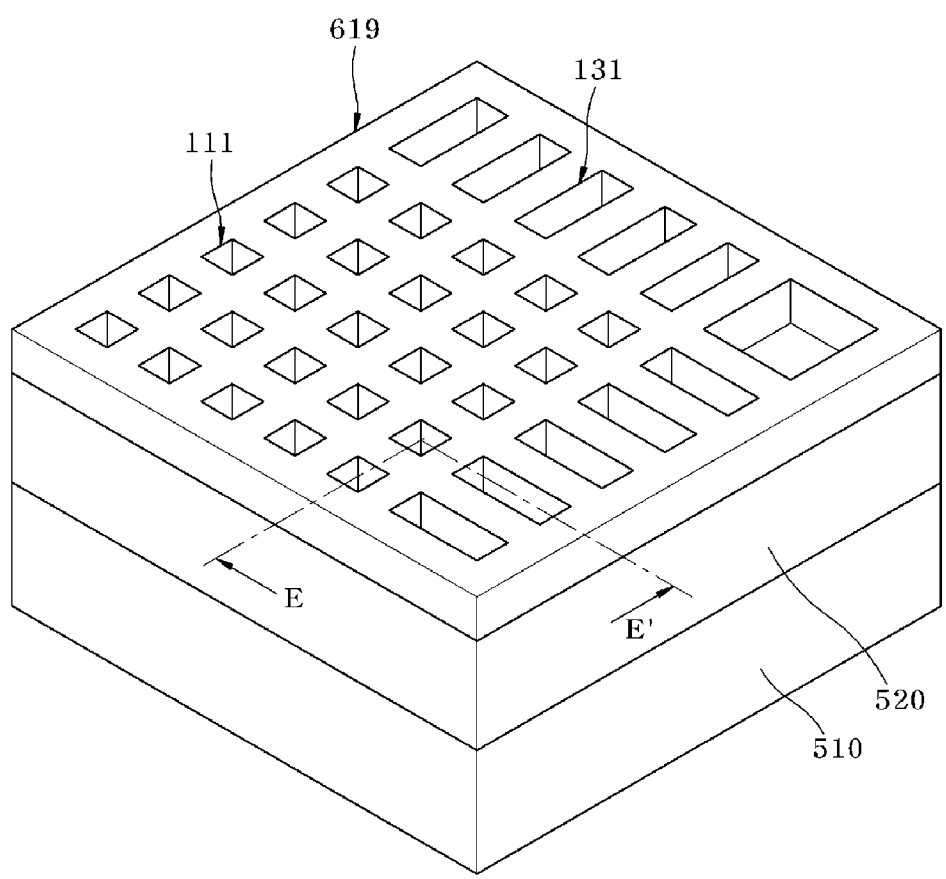

Referring to FIG. 11, a resist pattern 619 is formed by developing the firstly and secondly exposed resist layer 610. Then, a post-exposure bake (PEB) process is performed on the resist pattern 619. Since the overlapped regions 615 of the first and second exposures are in a state that the light having the exposure intensity or exposure dose higher than the threshold exposure intensity is incident, the overlapped regions 615 are dissolved in the developing solution during the development process and thus removed. Accordingly, the resist pattern 619 opening the cell hole patterns 111 corresponding to the designed cell hole patterns (110 in FIG. 1) and the dummy hole pattern 131 corresponding to the designed dummy hole patterns (130 in FIG. 1) is formed in a grid shape.

In this embodiment, the first and second photomasks 420 and 430 are used during the first and second exposure processes. Since each of the first and second photomasks 420 and 430 has the PSM region and the BM region, light having sufficient exposure intensity higher than the threshold intensity required in the exposure can be transferred on the semiconductor substrate 510 even at the end ports of the light transmission regions 210, 230, 310, and 330.

Figure 15:
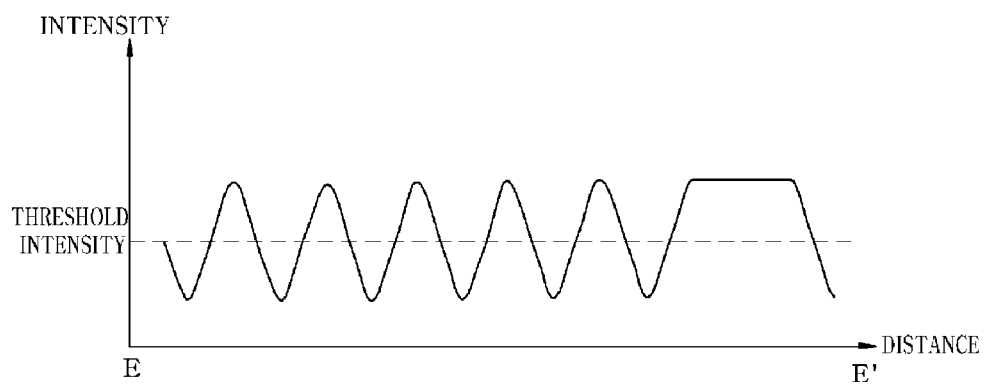
FIGS. 15 and 16 are views explaining a pattern bridge suppression effect obtained by a method for fabricating the fine pattern according to an embodiment of the present invention.

When simulating a total intensity distribution of the exposure light transferred to the resist layer 610, which is formed on the semiconductor substrate 510, by the first and second exposures in the E-E' line region of the first and second photomask layouts 200 and 300 of FIG. 3, the intensity profile illustrated in FIG. 15 is obtained. That is, the exposure light higher than the threshold intensity, which is the reference exposure/development intensity, is incident on the resist layer 610. Specifically, the exposure light higher than the threshold intensity is transferred to the resist layer 610 even in the region where the BM region 213 of the first cell light transmission region 210 and the PSM region 331 of the second dummy light transmission region 330 overlap, as well as the region where the PSM region 211 of the first cell light transmission region 210 and the PSM region 231 of the second cell light transmission region 230 overlap. Thus, dummy hole patterns (131 in FIG. 11) can be formed without bridging in the region where the BM region 213 of the first cell light transmission region 210 and the PSM region 331 of the second dummy light transmission region 330 overlap.

Figure 16:
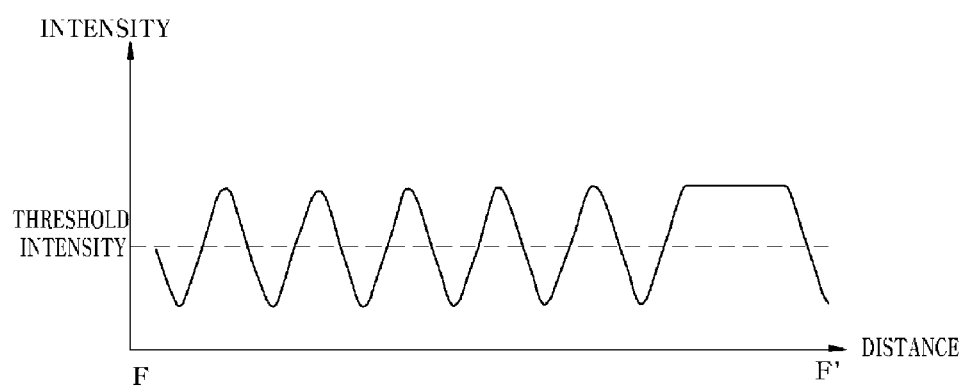

In addition, when simulating a total intensity distribution of the exposure light transferred to the resist layer 610, which is formed on the semiconductor substrate 510, by the first and second exposures in the F-F' line region of the first and second photomask layouts 200 and 300 of FIG. 3, the intensity profile illustrated in FIG. 16 is obtained. That is, the exposure light higher than the threshold intensity, which is the reference exposure/development intensity, is incident on the resist layer 610. Specifically, the exposure light higher than the threshold intensity is transferred to the resist layer 610 even in the region where the BM region 233 of the first dummy light transmission region 230 and the BM region 333 of the second dummy light transmission region 330 overlap, as well as the region where the PSM region 231 of the first dummy light transmission region 230 and the BM region 313 of the second cell light transmission region 310 overlap. Thus, dummy hole patterns (131 in FIG. 11) can be formed without bridging in the overlapped regions. Accordingly, the dummy hole patterns 131 as well as the cell hole patterns 111 can be formed in a designed shape.

When a photomask is formed to have only the PSM region, that is, when the second light blocking layers (425 and 435 in FIGS. 6 and 7) of the BM regions of the first photomask (410 in FIG. 4) and the second photomask (430 in FIG. 5) according to an embodiment of the present invention are removed to form the BM region or the PSM region, the intensity profile in which the exposure light is higher than the threshold intensity cannot be obtained. That is, the exposure is under dosed. Thus, the cell hole patterns 111 are normally formed, but pattern bridge may occur in the dummy hole patterns.

Due to the insufficient exposure intensity, when the end portions (213, 233, 313 and 333 in FIG. 3) of the first cell and first dummy light transmission regions (210 and 230 in FIG. 3) and the second cell and second dummy light transmission regions (310 and 330 in FIG. 3) are configured in the PSM structure, the first exposure light passing through the end portions 213, 233, 313 and 333 and the second exposure light passing through the first and second phase shift layers (423 and 433 in FIGS. 6 and 7) are destructively interfered by opposite phases. This is caused by the reduction in the intensity of the exposure light. However, when the end portions (213, 233, 313 and 333 in FIG. 3) of the first cell and first dummy light transmission regions (210 and 230 in FIG. 3) and the second cell and second dummy light transmission regions (310 and 330 in FIG. 3) are configured in the BM structure according to an embodiment of the present invention, the second exposure light is substantially blocked by the first and second light blocking layers (425 and 435 in FIGS. 6 and 7). Thus, the intensity of the first exposure light passing through the end portions 213, 233, 313 and 333 is not reduced to an undesirable extent. Compared with the PSM structure, the BM structure can obtain the same effect as 20-30% increase in the exposure intensity. That is, the BM structure can induce the effect that the patterns are formed even at a 20-30% reduced best dose. Therefore, it is possible to effectively suppress the pattern bridge caused by the insufficient exposure light intensity.

Figure 12:
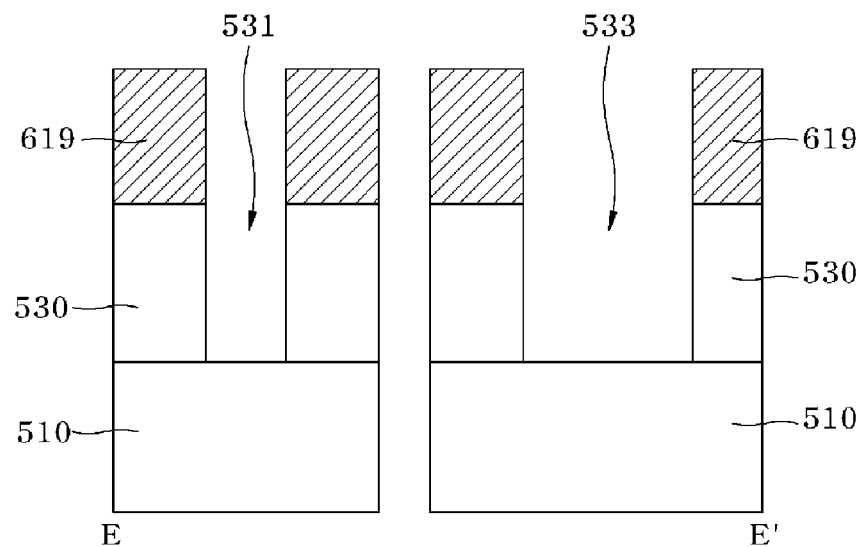

Referring to FIG. 12, a cell hole pattern 531 and a dummy hole pattern 533 passing through the insulation layer 530 may be formed by selectively etching the portion of the insulation layer 530 exposed by the resist pattern 619. The insulation layer 530 may be used as a hard mask to be used as an etch mask during a subsequent etch process or patterning process, or may be used as a mold that gives a pillar shape to a layer filling the cell hole pattern 531 and the dummy hole pattern 533.

Figure 13:
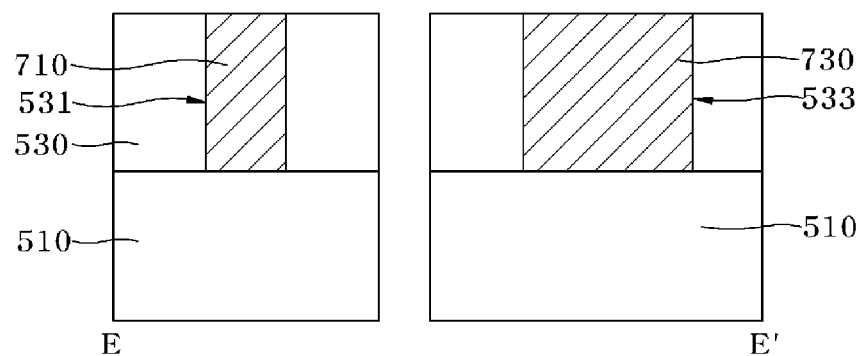

Referring to FIG. 13, the layer filling the cell hole pattern 531 and the dummy hole pattern 533 is deposited and planarized by, for example, a chemical mechanical polishing (CMP) process to form a cell pillar 710 and a dummy pillar 730. The cell pillar 710 is formed in a designed shape of the cell hole pattern 110 and the dummy hole pattern 130 illustrated in FIG. 1. When the cell and dummy pillars 710 and 730 are formed using the insulation layer for the hard mask, the insulation layer 530 is selectively removed to expose the cell and dummy pillars 710 and 730 as the hard mask. A trench for a field region defining a cell active region may be formed by selectively etching the semiconductor substrate 510 using the cell and dummy pillars 710 and 730.

Figure 14:
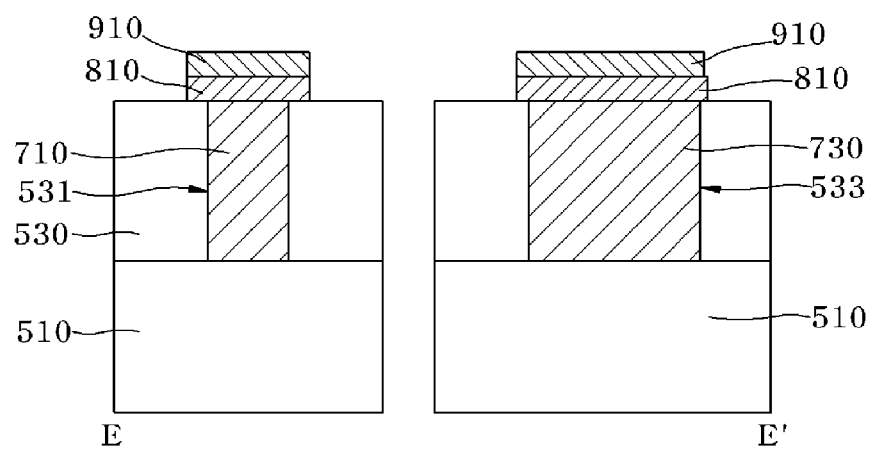
FIG. 14 is a view illustrating a phase change memory device fabricated by a method for fabricating the fine pattern according to an embodiment of the present invention.

In addition, when the cell and dummy pillars 710 and 730 include a conductive polysilicon layer or a metal layer such as, for example, a tungsten (W) layer or a titanium nitride (TiN) layer, they may be used as a bottom electrode of a phase change memory device. As illustrated in FIG. 14, after forming the cell and dummy pillars 710 and 730, a chalcogenide-containing phase change layer 810 and a top electrode 910 being a metal layer are formed and patterned to implement a phase change memory device.

As described above, the method for fabricating the fine pattern according to an embodiment of the present invention can be applied to the formation of the fine patterns which are repetitively arranged, such as the process of forming the bottom electrode of the phase change memory device, or the process of forming the hard mask which is to be used to form the trench for the field region defining the active region of the semiconductor device.

According to an embodiment of the present invention, when the resist layer is coated and the fine patterns are formed in the resist layer by a double lithography using two photomasks, the pattern bridge can be effectively suppressed during the exposure process by the improvement of the photomasks.

The various embodiments of the present invention have been disclosed above for illustrative purposes. Those skilled in the art will appreciate that various modifications, additions, and substitutions are possible, without departing from the scope and spirit of the invention as disclosed in the accompanying claims.

What is claimed is:

1. A method for fabricating a fine pattern, comprising:
    forming a first photomask including first light transmission regions set in a line shape over a first phase shift mask (PSM) region and a first binary mask (BM) region adjacent to the first phase shift mask region;
    forming a second photomask including second light transmission regions set in a line shape over a second phase shift mask region and a second binary mask region adjacent to the second phase shift mask region, wherein the second light transmission regions intersect the first light transmission regions;
    exposing a resist layer using the first photomask;
    exposing the resist layer using the second photomask; and
    developing the resist layer exposed to the first and second photomasks to form resist patterns with open regions corresponding to portions where the first light transmission regions intersect the second light transmission regions.

2. The method of claim 1, wherein the first phase shift mask region is formed to include a phase shift layer that opens a portion of a transparent substrate of the first photomask corresponding to the first light transmission region located in the first phase shift mask region on the transparent substrate, and the first binary mask region is formed to include a dual layer of a phase shift layer and a light blocking layer, which opens a portion of the transparent substrate of the first photomask corresponding to the first light transmission region located in the first binary mask region on the transparent substrate.

3. The method of claim 1, wherein the first photomask is substantially similar to the second photomask rotated by 90 degrees.

4. The method of claim 1, wherein the first light transmission regions comprise:
    first cell light transmission regions repetitively arranged in a line shape; and
    a first dummy light transmission region in a line shape arranged outside the first cell light transmission regions, wherein a line width of the first dummy light transmission region is larger than the line width of the first cell light transmission region.

5. The method of claim 1, further comprising:
    forming an under layer below the resist layer;
    forming hole patterns by etching a portion of the under layer exposed to the resist patterns; and
    forming pillars filling the hole patterns.

6. The method of claim 5, wherein, in a phase change memory device including bottom electrodes, phase change layers, and top electrodes, the pillars are formed as the bottom electrodes of the phase change memory device.

7. A method for fabricating a fine pattern, comprising:
    forming a first photomask that includes:
        a first phase shift mask region including a first phase shift layer with body portions of first light transmission regions having a line shape on a first transparent substrate; and
        a first binary mask region including a first light blocking layer with end portions of the first light transmission regions;
    forming a second photomask which includes:
        a second phase shift mask region including a second phase shift layer with body portions of second light transmission regions having a line shape on a second transparent substrate, wherein the second light transmission regions intersect the first light transmission regions; and
        a second binary region including a second light blocking layer with end portions of the second light transmission regions;
    forming a resist layer on an under layer;
    exposing regions corresponding to the first light transmission regions of the resist layer using the first photomask;
    exposing regions corresponding to the second light transmission regions of the resist layer using the second photomask; and
    developing the resist layer exposed to the first and second photomasks to form resist patterns with open regions corresponding to portions at intersection of the first and second light transmission regions.

8. The method of claim 7, wherein the first photomask is substantially similar to the second photomask rotated by 90°.

9. The method of claim 7, wherein the first light transmission regions comprise:
    first cell light transmission regions repetitively arranged in a line shape; and
    a first dummy light transmission region having a line shape, arranged outside the first cell light transmission regions, wherein a line width of the first dummy light transmission region is larger than the line width of the first cell light transmission region.

10. The method of claim 7, wherein hole patterns are formed at the open regions.

11. The method of claim 10, further comprising forming pillars filling the hole patterns.

12. A method for fabricating a fine pattern, comprising:
forming a first photomask including first cell light transmission regions and a first dummy light transmission region in a line shape extending over a first phase shift mask region and a first binary mask region adjacent to the first phase shift mask region;
forming a second photomask including second cell light transmission regions and a second dummy light transmission region in a line shape extending over a second phase shift mask region and a second binary mask region adjacent to the second phase shift mask region, wherein the second cell light transmission regions and the second dummy light transmission region intersect the first cell light transmission regions and the first dummy light transmission region;
forming a resist layer on an under layer;
exposing the resist layer using the first photomask;
exposing the resist layer using the second photomask;
developing the resist layer exposed to the first and second photomasks to form resist patterns with open regions corresponding to portions where the first cell light transmission regions and the first dummy light transmission region intersect the second cell light transmission regions and the second dummy light transmission region; and
forming cell hole patterns and dummy hole patterns by etching portions of the under layer exposed to the resist patterns.

13. The method of claim 12, wherein the forming of the first and second photomasks comprises:
obtaining a target layout that includes the cell hole patterns and the dummy hole patterns disposed outside the cell hole patterns;
obtaining a layout of the first and second cell light transmission regions and the first and second dummy light transmission regions, in which the cell hole patterns are set by the portions of the first cell light transmission regions that intersect the second cell light transmission regions, and the dummy hole patterns are set by the portions of the first dummy light transmission region that intersect the second cell light transmission regions, the portions of the second dummy light transmission region that intersect the first cell light transmission regions, and the portions of the first dummy transmission regions that intersect the second dummy transmission regions;
setting the first and second phase shift mask regions and the first and second binary mask regions in the layout of the first and second cell light transmission regions and the first and second dummy light transmission regions; and
forming the first photomask using the layout of the first cell light transmission regions and the first dummy light transmission region, and forming the second photomask using the layout of the second cell light transmission regions and the second dummy light transmission region.

14. The method of claim 12, wherein the first phase shift mask region is formed to include a phase shift layer that opens a portion of a transparent substrate of the first photomask corresponding to the first cell light transmission region that is located in the first phase shift mask region on the transparent substrate, and the first binary mask region is formed to include a dual layer of a phase shift layer and a light blocking layer, which opens a portion of the transparent substrate of the first photomask corresponding to the first light transmission region that is located in the first binary mask region on the transparent substrate.

15. The method of claim 12, wherein a line width of the first and second dummy light transmission regions is larger than a line width of the first and second cell light transmission regions.

16. The method of claim 12, further comprising forming pillars filling the cell hole patterns and the dummy hole patterns.

* * * * *